US006697774B1

(12) United States Patent
Panesar

(10) Patent No.: US 6,697,774 B1
(45) Date of Patent: Feb. 24, 2004

(54) APPLICATION SPECIFIC PROCESSOR (ASP)

(75) Inventor: Gajinder Singh Panesar, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/344,871

(22) Filed: Jun. 28, 1999

(30) Foreign Application Priority Data

Jun. 29, 1998 (GB) .............................................. 9814017

(51) Int. Cl.⁷ ........................ G06F 17/50; G06F 9/455
(52) U.S. Cl. ............................. 703/21; 703/20; 703/27; 716/1
(58) Field of Search .............................. 703/21, 14, 15, 703/20, 24, 25, 27; 716/1, 4, 18

(56) References Cited

U.S. PATENT DOCUMENTS

| 5,546,566 A | * | 8/1996 | Katsuta ........................ 703/28 |
| 5,557,774 A | | 9/1996 | Shimabukuro .............. 395/500 |
| 5,684,980 A | | 11/1997 | Casselman |
| 5,710,934 A | | 1/1998 | Bona et al. |
| 5,857,091 A | * | 1/1999 | Fernandes et al. ............. 703/21 |
| 5,867,400 A | * | 2/1999 | El-Ghoroury et al. ......... 716/1 |
| 5,954,824 A | * | 9/1999 | Cherichetti et al. ......... 307/407 |
| 5,995,736 A | * | 11/1999 | Aleksic et al. ................. 716/18 |
| 6,009,256 A | | 12/1999 | Tseng et al. |
| 6,016,554 A | | 1/2000 | Skrovan et al. |
| 6,058,253 A | | 5/2000 | Lowe |
| 6,199,031 B1 | * | 3/2001 | Challier et al. ................ 703/14 |
| 6,314,416 B1 | | 11/2001 | Schiefele |
| 6,389,379 B1 | | 5/2002 | Lin et al. |

FOREIGN PATENT DOCUMENTS

| EP | 0 683 463 A | 11/1995 | |
| WO | WO 96 28788 A | 9/1996 | |
| WO | WO 97/13209 | 4/1997 | ........... G06F/17/50 |

OTHER PUBLICATIONS

European Search Report from European Patent Application 99304686, dated Nov. 2, 1999.
European Search Report from European Patent Application 99304687, dated Nov. 2, 1999.
European Search Report from European Patent Application 99304713, dated Nov. 1, 1999.
Standard Search Report from RS 101718 Completed Nov. 19, 1998.
Akaboshi H. et al., *Automatic Generation of Command Level Simulation Model of a Processor From RT Level Description*, Elect. & Comms in JP, Part III, Fundamental Elect. Sci. vol. 79, No. 5, May 1996, pp 35–45, XP000630738.
Sato, J. et al., Peas–I: *A Hardware/Software Codesign System for ASIP Development*, IEICE Trans on Fundamentals of Electronics, Communications and Computer Sciences, vol. E77–A, No. 3, Mar. 1994, pp 483–49, XP000450885.

* cited by examiner

Primary Examiner—W. Thomson
(74) Attorney, Agent, or Firm—Lisa K. Jorgenson; James H. Morris; Wolf, Greenfield & Sacks, P.C.

(57) ABSTRACT

A modelling tool for use in defining an ASP which receives as its input an input file which for each of a set of peripherals defines the functional attributes of that peripheral in a high level language with an input data structure and which generates from the input file, (i) an interface functions file, which defines the communication attributes of the peripheral with the processor and the functional attributes of the peripheral in a manner independent of any particular data structure, (ii) a test functions file which defines the communication attributes of the processor with the peripheral in a manner independent of any particular data structure, and (iii) a register definition file by allocating specific elements of the input data structure to predefined sectors of a register definition table.

14 Claims, 4 Drawing Sheets

APPLICATION SPECIFIC PROCESSOR (ASP)

FIELD OF THE INVENTION

The present invention relates to the design of an application specific processor (ASP) and in particular to the use of a modelling tool in the design process to aid the development of architectural modelling.

BACKGROUND OF THE INVENTION

In a design process of an ASP, a model is constructed based on a CPU and a set of peripherals. Three basic types of data are required to be generated before any "real modelling" can start. These can be summarised as follows:

A set of low level functions and constants to aid the integration of a functional model of a peripheral in a modelling language such as C.

A set of low level functions and constants to aid the testing of the functional model. This code would execute on a simulation of the CPU and would also be useful for functional verification.

A register or data structure mapping, indicating the size of various fields within the register, the reset state and its function.

Typically this set of data is generated by hand and must be completed before any real modelling can start. The generation by hand is a laborious task and is prone to all the usual human errors.

It is an object of the present invention to make the task less labour intensive, particularly in respect of the low level communication functions between the peripheral and the processor.

SUMMARY OF THE INVENTION

According to one aspect of the present invention there is provided a method of operating a computer system to design an application specific processor (ASP) comprising:

defining a set of peripherals for the ASP which are responsive to stimuli and which communicate with a processor;

generating for each peripheral an input file which defines the functional attributes of that peripheral in a high level language with an input data structure;

entering the file into the computer system and operating a modelling tool loaded on the computer system to generate from the input file at least an interface functions file which defines the communication attributes of the peripheral with the processor and the functional attributes of the peripheral in a manner independent of any particular data structure, and a test functions file which defines the communication attributes of the processor with the peripheral in a manner independent of any particular data structure; and using the interface functions file and test functions file to generate a functional model in a high level language for simulating the architectural behaviour of the ASP.

According to another aspect of the present invention there is provided a computer system which comprises; a processor and a memory, the memory holding a program representing a modelling tool for use in designing an application specific processor (ASP), wherein the computer system comprises an input means for receiving a plurality of input files, each input file defining the functional attributes of a peripheral for the ASP in a high level language within an input data structure;

the processor being operable to execute the program representing the modelling tool to generate from the input file at least an interface functions file which defines the communication attributes of the peripheral with the processor and the functional attributes of the peripheral in a manner independent of any particular data structure, and a test functions file which defines the communication attributes of the processor with the peripheral in a manner independent of any particular data structure; and the computer system further comprising an output means for outputting said interface functions file and said test functions file in a manner such that they are usable to generate a functional model in a high level language for simulating the architectural behaviour of the ASP.

The input file can be loaded into the computer on a disk or similar physical recording device. Likewise, the interface functions file and test functions file can be recorded onto a physical recording device such as a disk.

The invention also provides a modelling tool for use in defining an ASP which receives as its input an input file which for each of a set of peripherals defines the functional attributes of that peripheral in a high level language with an input data structure and which generates from the input file.

(i) an interface functions file, which defines the communication attributes of the peripheral with the processor and the functional attributes of the peripheral in a manner independent of any particular data structure, (ii) a test functions file which defines the communication attributes of the processor with the peripheral in a manner independent of any particular data structure, and (iii) a register definition file by allocating specific elements of the input data structure to predefined sectors of a register definition table.

The modelling tool described herein ensures that the generation of the above sets of data are completely in sync. It also greatly reduces the time to develop the models of various peripherals by allowing the designer to concentrate on the task at hand—that of the peripheral itself. The tool also makes it possible for novice designers to get started using the peripheral modelling much quicker by not having to learn about the finer details of a particular simulator, for example by removing the need to learn details of how to send and receive data from the simulator to the peripheral.

The modelling tool is designed for use in an environment in which a simulator simulates a CPU and a memory system to which peripherals can be added.

Peripheral and subsystem support is provided by allowing the user to define a set of functions for each device that will simulate its behaviour. These functions are compiled into a device library by the user, and loaded by the simulator during execution. All the device libraries for, the devices being simulated are listed in a device definition file. When the simulator is executed, these functions are: dynamically linked with the simulator code.

Each device has an address range associated with it in the device definition file. Any load from or store to, an address in that range will cause the simulator to execute the appropriate peripheral read or write function instead of a memory access.

The following functions are provided in each device library:

An initialization function which is run when the simulation starts before any application code is executed. This function must set up a structure with the names of the other functions.

A loop function which executes regularly. The loop function is used to define asynchronous or delayed behaviour by the device, such as sending an interrupt. Each device has a loop cycle step variable which defines the frequency of execution, i.e. how many instructions are executed between two executions of the loop function. By default, the loop function is executed after every instruction.

A function for each type of signal expected from the CPU. For peripherals this would usually be one function for Load (called the peripheral read) and one for Store (called the peripheral write). These functions are called by the simulator where an appropriate instruction is executed for an address related to the device. They define any immediate device response to the signal, such as sending back a value when a shared register location is loaded.

As an example, suppose that the application running on the CPU executes a load from a peripheral address. At this point the simulator calls the peripheral read function in the peripheral model dynamic library. The peripheral read function returns the data stored at the address and the simulator then places this value onto the stack.

A typical peripheral model and its integration within a functional simulator is shown in FIG. 2. The peripheral is written in a high level language such as C and the code for this model operates upon data structures written in a manner which aids the architecture development. In order for the CPU, and hence code executing on the CPU, to access various bits of state or data, such as a control register, it must read or write to various words in memory. The read peripherals being modelled are memory mapped in the CPU memory space. The states or data structures that are maintained within the model which are visible to the CPU, and hence to the code, must be copied to or from the registers or memory. The simulator has special calls to handle accesses to special areas such as memory.

The peripheral model writer declares an area of memory that is to be treated as special, in this case seen as the registers memory or a data structure memory. When the CPU accesses this area of memory the peripheral model must copy or update its internal representation of the externally visible state. This is usually done by the Read and Write functions in the simulator. These functions allow the modelling to proceed in a free and easy manner, without any constraints on how it should be written or how data should be manipulated and only when it is necessary to transfer the data to the outside world is it done so via these functions. The description of the registers and data structure visible to the CPU within the peripheral will be described within the functional specification document for that peripheral.

The modelling tool described herein automates the generation of the low level functions, constants and the basis of the documentation by using the data structures specified by the peripheral model. There is sufficient information within the specification of these data structures to generate these low level functions and the documentation, using some basic conventions developed by the inventor.

These can be summarised as:

All accesses to the data structures used within the peripheral model are done via functions. These are Query, and Set functions for each attribute (element) for each data structure.

All accesses to the registers are done via functions with a common interface.

The names of all the functions are derived from the attributes and structure definition of the data structures.

All constant names used to access bits within registers are derived from the attributes and structure definition of the data structures.

For a better understanding of the present invention and to show how the same may be carried into effect reference will now be made by way of example to the accompanying drawings.

DESCRIPTION OF THE PREFERRED EMBODIMENTS

Figure 1:
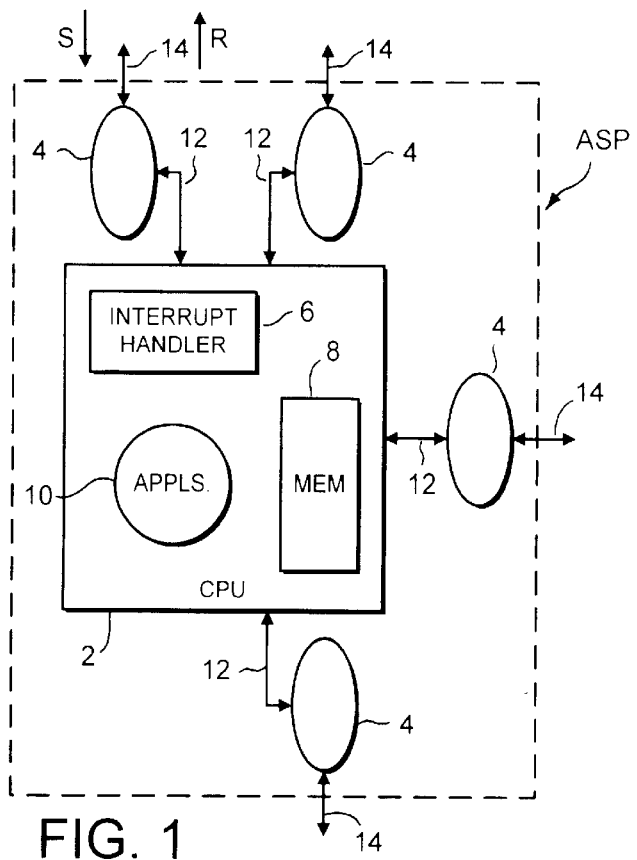
FIG. 1 is a block diagram illustrating the modelling of an ASP.

An application specific processor is modelled as a central processor (CPU) 2 and a set of peripherals 4. The CPU 2 is modelled with the basic elements of an interrupt handler 6 and memory 8. A set of applications running on the CPU are denoted by the process circle 10 labelled APPLS. Each peripheral 4 is modelled with an internal interface 12 between the peripheral and the CPU 2 and an external interface 14 between the peripheral and the "outside world", that is externally of the ASP. At the time of modelling the ASP, it is not known whether or not the peripherals will in fact be implemented in software, hardware or some combination of both. However, whether finally implemented in software or hardware or some combination of both, the peripherals 4 represent how the central processor 2 cooperates with the external environment. The external interfaces 14 receive stimuli S from the external environment and generate responses R in response to the stimuli. These are carried by the external interface 14. The internal interfaces 12 carry state information and data between the peripherals and the applications 10 running on the CPU 2. This is described in more detail with reference to FIG. 2.

Figure 2:
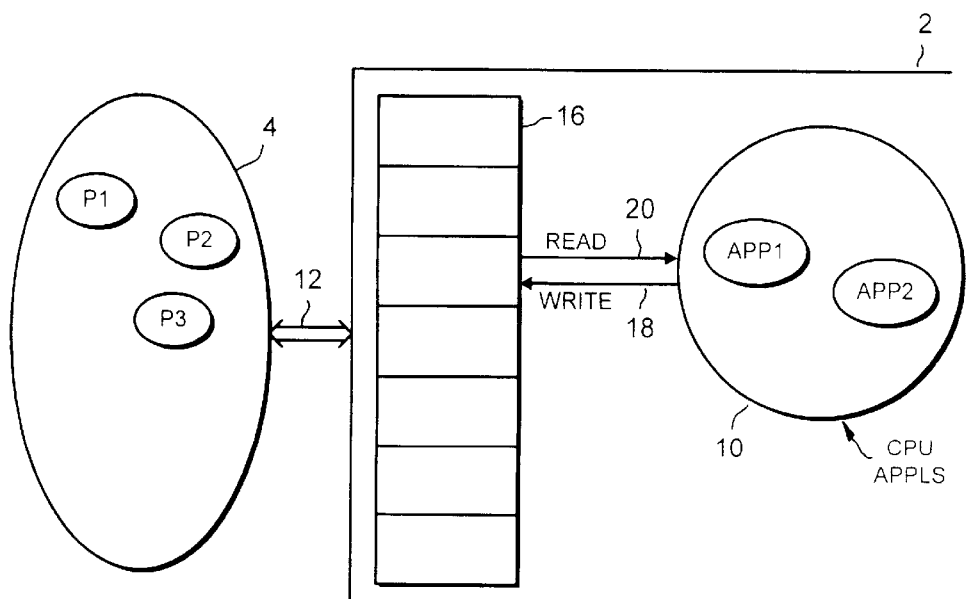
FIG. 2 is a diagram illustrating the CPU to peripheral interfaces.

FIG. 2 illustrates a single peripheral 4 which is to be modelled as a plurality of peripheral processes P1,P2,P3 etc. The CPU 2 is shown only with its applications 10 and a register bank 16. The register bank 16 represents a particular area of memory which may be modelled as registers or a conventional RAM which is dedicated to activities of that peripheral. A number of different applications may be running on the CPU 2, denoted APP1,APP2, etc. The applications 10, running on the CPU are able to write data to the register bank 16 along the write path 18 and can read data from the register bank 16 along the read path 20. These register read and writes are simulated as CPU Read/Write functions. In addition the peripheral 4 needs to be able to receive data and state from the register bank 16 and to write data and state to the register bank 16. This is accomplished by the interface 12. The modelling tool described herein is valuable for implementing the interface 12 in the modelling phase, the simulation phase and the implementation (silicon) phase of the design process. It is not a trivial matter to model, simulate or implement the interface 12. In designing an ASP, the peripherals 4 are modelled in a high: level language such as C. One of the facets of that language is that the data structure which is utilised is written in a manner which aids architecture development in particular in terms of its portability between environments. In particular, it allows the definition, modification and access of individual elements very easily, regardless of the length of the element. This is a particularly useful feature when designing or modelling because it means that the length of elements can be altered without requiring a complete revision of the modelling code. C also allows very simple access to an element, regardless of its length. However, this facet of C and other high level languages creates a practical difficulty when the code developed in that language has to be simulated with applications running on a conventional CPU and using fixed length registers. The tool described herein provides a mechanism for greatly simplifying this task.

Figure 3:
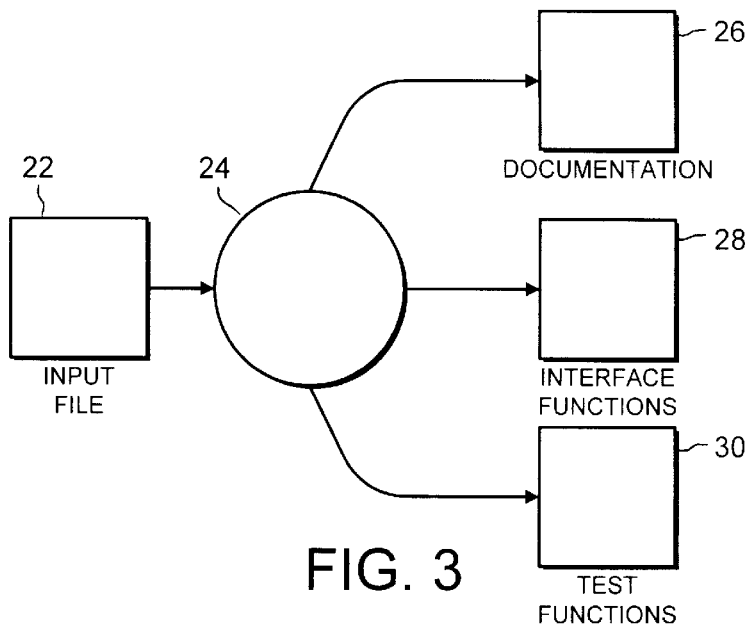
FIG. 3 is a diagram illustrating the function of the modelling tool.

FIG. 3 shows in general terms how this is achieved.

An input file is created for each peripheral 4 in a high level language such as C using an input data structure compatible with that language. That input file defines the interfacing behaviour of the peripheral 4 with respect to the CPU. The architect determines the responses R of the peripheral with respect to external stimuli S. A modelling tool 24 generates automatically from the data structure defined in the input file 24 a documentation file 26, an interface functions file 28, and a test functions file 30.

The interface functions file 28 contains a set of "glue" functions which are derived from the individual elements of the data structure in the input file 22 but which are defined in a manner which is independent of any particular data structure. The "glue" functions define the attributes of the interface 12 and include:
 constant definitions
 read functions
 write functions
 query functions
 set functions.

The constant definitions define the context for the peripheral.

In particular, they define the address range in memory associated with the device being modelled by that peripheral and bit locations within the registers of particular elements of the data structure. Any load from or store to an address in that defined range will cause a simulator to execute the appropriate peripheral read or write function instead of a memory access.

The read and write functions allow the peripheral to read and write data and state from and to the specified register of the CPU.

Query functions allow the peripheral to request a value from a specified register in the CPU.

Set functions allow the peripheral to write a value to a specified register of the CPU.

The documentation file defines the registers and their contents for use in setting up a simulator on the CPU.

The test functions take the form define the attributes of the CPU read/write paths 18, 20 and include:
 constant definitions
 read functions
 write functions.

The constant definitions match those already defined as part of the interface function file 28. Likewise, the read and write functions allow the CPU to read and write from the specified registers. Once again the functions are defined such that they have a common name but are implemented in a manner which is dependent on the environment.

Figure 4:
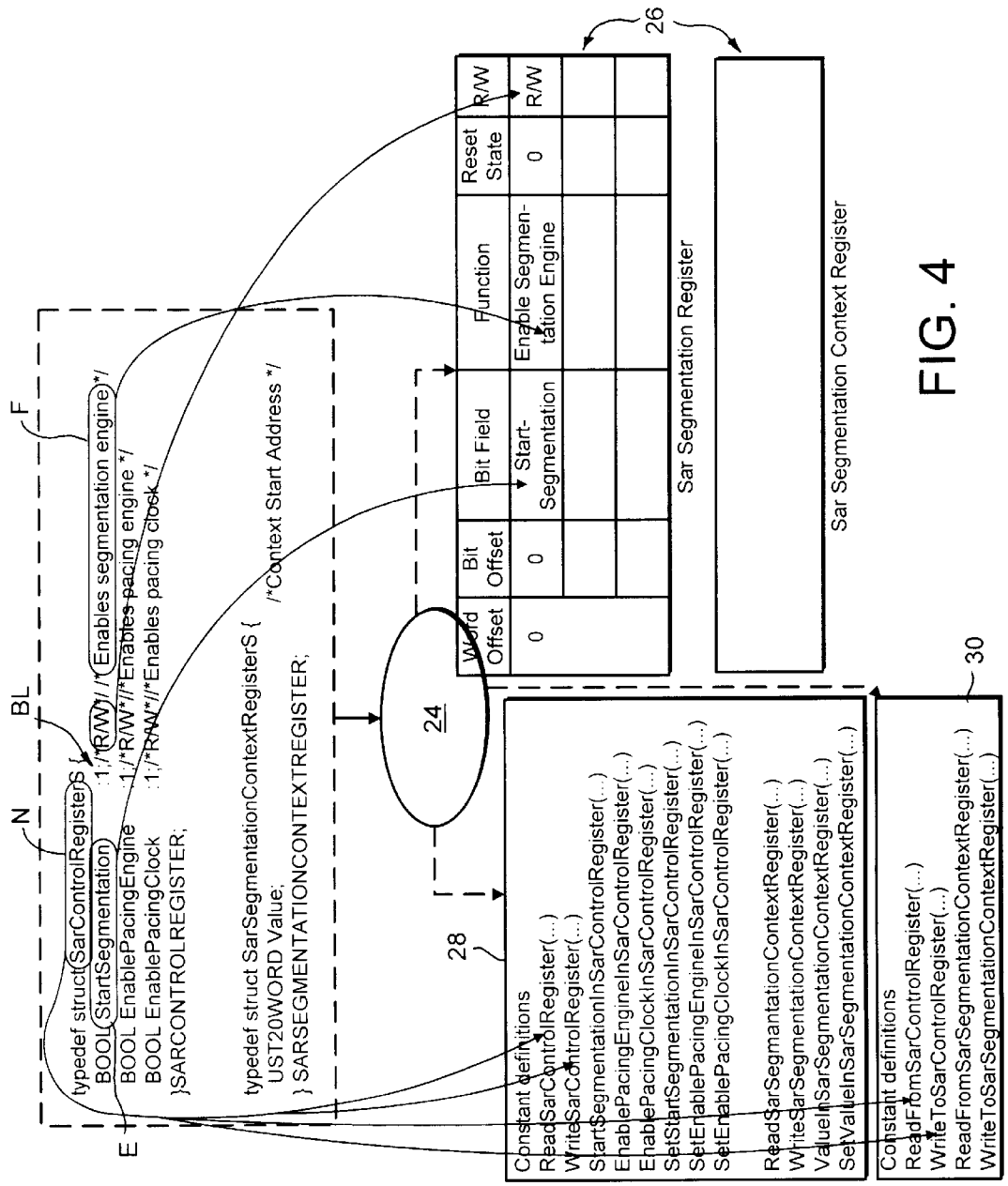
FIG. 4 is a diagram illustrating how the files are derived from the data structure of the input file using the modelling tool.

The modelling tool 24 generates the documentation file 26, interface functions file 28 and test functions file 30 by using the data structure specified for the peripheral model. The inventor has realised that there is sufficient information within the specification of these data structures to generate the contents of these files automatically. An example is illustrated in FIG. 4. In FIG. 4, the input file 22 is shown defining the data structure for the registers named:
 SarControlRegister, and
 SarSegmentationContextRegister.

The register named SarControlRegister has a data structure comprising three elements each having a length of one bit and which defines one of the following:
 StartSegmentation
 EnablePacingEngine
 EnablePacingClock.

The SarSegmentationContextRegister has a data structure comprising one element having a length of 32 bits defining a ContextStartAddress.

FIG. 4 illustrates how the functions for the various files can be derived directly from the data structure of the input file using a naming convention. The NAME N of the register is used to directly define the read and write functions for the interface function file 28 in the form of:
 Read NAME
 Write NAME
and the test function file 30 in the form:
 Read From NAME
 Write To NAME In the example of FIG. 4, this is done for both the SarControlRegister and the SarSegmentationContextRegister. The query and set functions are defined by reference to each ELEMENT E of the data structure in the form:
 ELEMENT In NAME
 Set ELEMENT In NAME The documentation file 26 is set up for each register by deriving information directly from the data structure as indicated in FIG. 4. Thus, each register definition comprises the following parameters:
 word offset—defining an offset location of the register in memory
 bit offset—defining the bit location of each element in the register and derivable from the bit length BL in the data structure
 bit field—naming the element of that bit location
 function—defining the function F of the element
 reset state—value of entity on reset
 read/write—whether entity read or writable from CPU The contents for each field to define these parameters can be derived directly from the data structure of the input file 22. To avoid over-complicating the figure, the arrows are shown only for the read and write functions in respect of the SarControlRegister and, as far as the documentation file is concerned, only for the first bit location of that register. Tables 1 and 2 show the complete documentation files for the SarControlRegister and SarSegmentationContextRegister.

For each of the typedefs in the input file a table will be generated which will describe the allocation of the attributes to the words that make up the data structure in the CPU memory space. Each table will also describe the allocation of the bits within the word(s) as well as the meaning associated to these bits. The reset state will be given, and whether the attribute (bits are read, writable or both. The allocation of the bits within a word and indeed the words themselves will be driven by command line arguments to the modelling tool. The documentation file can be output in various formats, for example ascii and mif. The files are intended to be included or pasted into the main functional (or other) specification of the peripheral.

Figure 5:
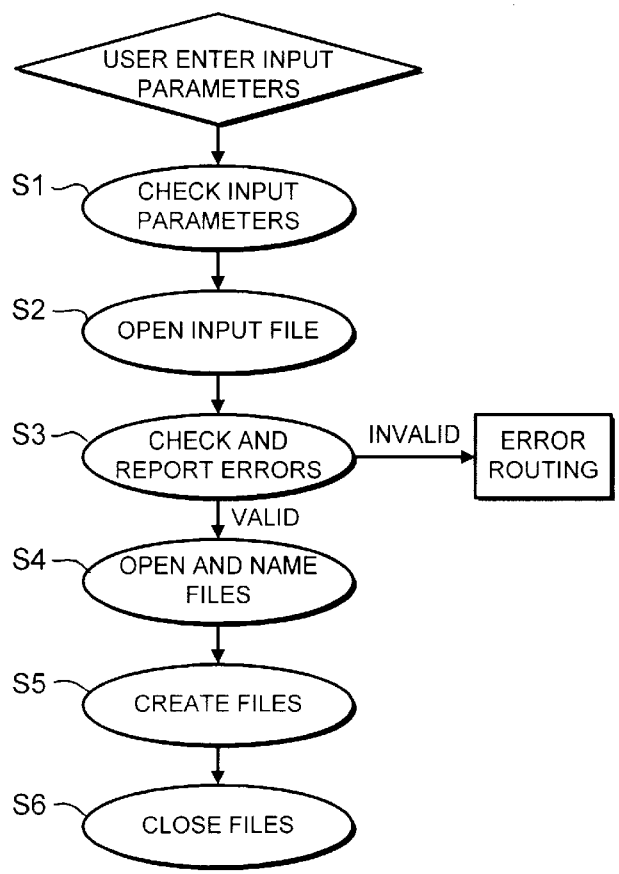
FIG. 5 is a flow chart illustrating the high level operation of the modelling tool.

FIG. 5 is a flow chart illustrating high level operation of the modelling tool 24. At step S1, input parameters given to the modelling tool are checked. At step S2, the input file corresponding to one of the specified parameters is opened. Its contents are checked and any areas are reported in a meaningful manner (step S3) by an error routine. If the contents of the input file are valid, the files are opened and named at step S4. At step S5, the files are created as described earlier with reference to FIGS. 3 and 4. Finally, at step S6, the files are closed.

Some specific examples are given in the following annexes.

Annexe 1 is an exemplary BNF sequence (Backus Naur Form of notation) for an input file 22. Annexe 2 is an example of a simple data structure within the input file, and Annexe 3 is an example of a data structure of medium complexity within the input file.

Annexe 4 is an exemplary BNF sequence for the read function of the interface functions file for a data structure of medium complexity and Annexe 5 is an example of an output fragment.

Annexe 6 is an exemplary BNF sequence for a write function for the interface functions file for a data structure of medium complexity and Annexe 7 is an example of an output fragment.

Annexe 8 is an exemplary BNF sequence for a query function for a data structure of a simple type and Annexe 9 is an example output fragment. Annexe 10 is an exemplary BNF sequence for a set function of a simple data structure type and Annexe 11 is an example of an output fragment.

For the test functions file 30, Annexe 12 is an exemplary BNF sequence for a read function for a data structure of medium complexity, and Annexe 13 is an exemplary output fragment. Annexe 14 is an exemplary BNF sequence for a data structure of medium complexity for the write function of the test functions file 30 and Annexe 15 is an exemplary output fragment.

Annexe 16 is one example in BNF format of a documentation file.

Figure 6:
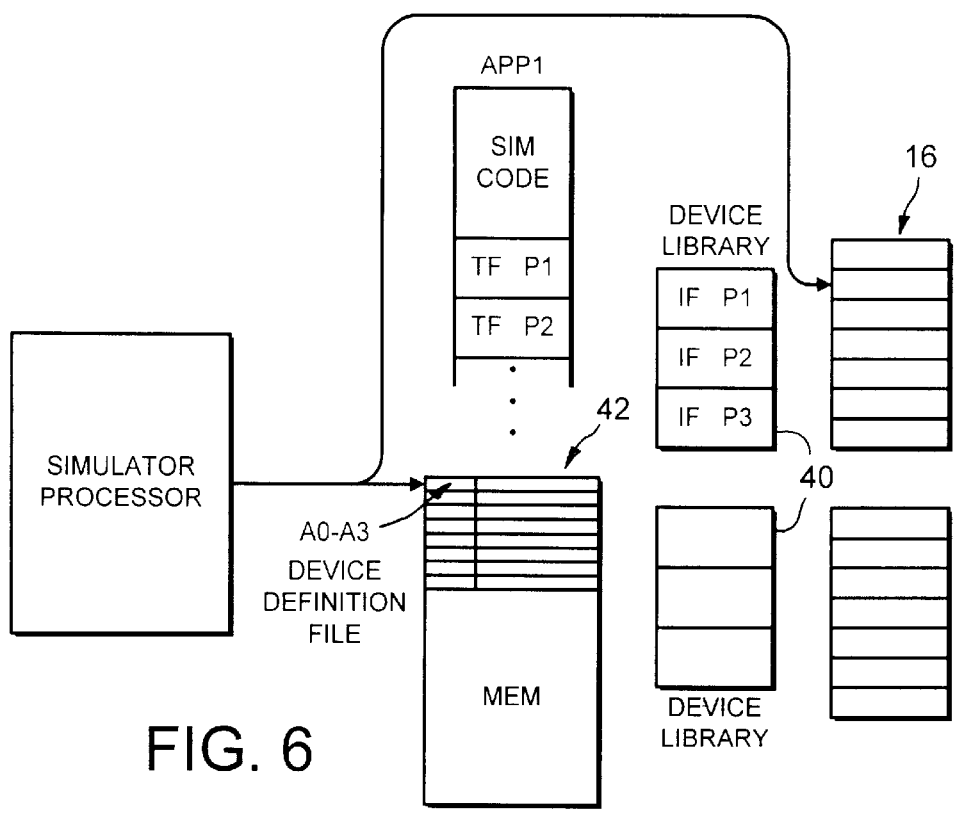
FIG. 6 is a sketch illustrating the use of the files in a simulation.

FIG. 6 shows how the modelling tool used herein is used in the simulation phase of a design process. Each peripheral device has a set of functions which simulate its behaviour. These are created as the input file 22 for each peripheral device. As already explained, each peripheral device may have a number of different simulated processes, P1,P2,P3, etc (see FIG. 2). The input file 22 defines each peripheral device and therefore may include information about each of the individual simulation processes. As described above, the input file is entered into a processor which is loaded with the modelling tool 24 and which thus generates the various files illustrated in FIG. 3. As already mentioned, these include an interface functions file 28 and a test functions file 30. The interface functions file for each peripheral device is held in a device library 40. In FIG. 6, the denotation IFP1 denotes the interface functions for the simulated process P1 of the peripheral device. The test functions for each simulated process form part of the simulation code for the applications to be run on the CPU. The denotation TFP1 denotes the test function for the simulated process P1. In FIG. 6 it is illustrated as running in the simulated version of application 1, APP1. A device definition file 42 holds a list of the device libraries. Each device has an address range associated with it in the device definition file. Any load from or store to an address in that range will cause the simulator to execute the appropriate peripheral read or write function instead of a memory access. For example, if the simulator processor attempts to access an address in range A0 to A3, this maps onto the device library 40 holding the simulating processes for the peripheral of FIG. 2. Instead of allowing the access to go ahead, that causes the simulator processor to perform the function defined by the relevant interface function file. This causes data to be written to, accessed from or modified in the representation of the register bank 16 associated with that peripheral. This type of access may have been caused by the simulator processor running code from the test functions incorporated within the process being simulated, APP1 or by code within the device libraries if the peripherals are at that time being simulated. Either way, the representation of the register bank 16 associated with that peripheral device is kept correctly updated.

Figure 7:
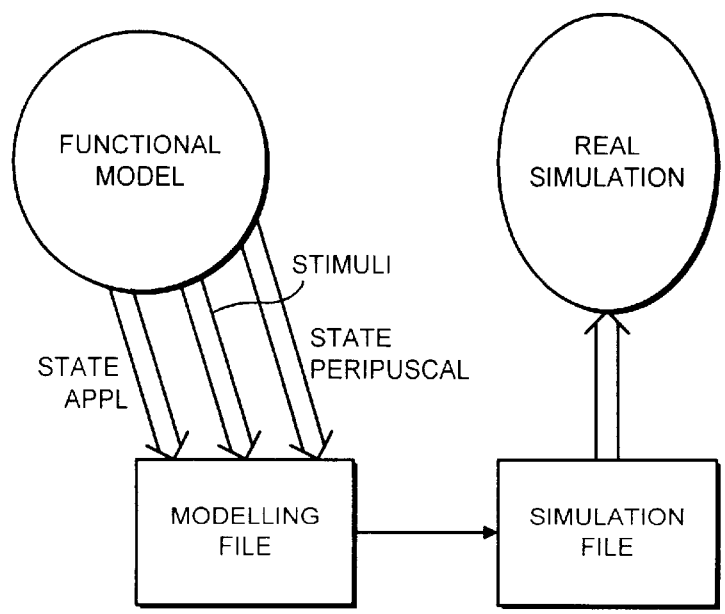
FIG. 7 is a sketch illustrating how a functional model can interact with a real simulation.

The modelling tool described herein gives rise to another advantage. FIG. 7 illustrates a functional model for the application specific processor (ASP) running in a high level language such as C, and a real simulation which will run in a simulation language such as VHDL. The real simulation simulates the actual implemented chip down at the transistor level, and is used before the circuit which has been designed is actually implemented in silicon. The real simulation itself is necessary prior to implementing a circuit in silicon to try and establish as far as possible how an actual device will, operate. However, real simulations are very slow. Conversely, the functional model itself can run quite quickly, although of course that is only modelling the architecture and not the actual silicon implementation as designed. However, because the modelling tool described herein generates matching test function and interface function files for each peripheral device, it is possible to speed up the real simulation by running the functional model for an initialisation or set up phase (or any other phase) and, at the end of that phase, extracting the state of the application programs, APP1,APP2 at a particular point in time and the state of the peripheral devices at the same point of time. The state of the application programs and the environmental stimuli can be derived from the test function files 30 and the state of the peripheral devices can be derived from the interface function files 28. The contents of these files are loaded into a modelling file which is translated into a simulation file which can be loaded into the real simulation process. The modelling file can be in memory or on disk, as can the simulation file. Thus, it is possible for the functional model and the real simulation to run on the same CPU, with a transfer of the modelling file to the simulation file in the CPU memory. Alternatively, the functional model can be run on one CPU, with the modelling file being on a transferable disk which can be translated onto a simulation file and loaded into another CPU running the real simulation. The extraction of state from the functional model at a particular point in time in order to "kick start" the real simulation significantly reduces the overall simulation time. The environmental stimuli from and to the peripheral devices at that point of time can also be derived from the functional model and loaded into the real simulation.

Another advantage of the modelling tool described herein is its generation of the documentation file 26. This defines the actual registers and can be used therefore to implement these registers in a final silicon implementation. This significantly reduces the amount of manual design work that needs to be carried out.

TABLE 1

Sar Control Register

| Word Offset | Bit Offset | Bit Field | Function | Reset State | R/W |
|---|---|---|---|---|---|
| 0 | 0 | Start Segmentation | Enables segmentation engine | 0 | R/W |
|   | 1 | Enable Pacing Engine | Enables pacing engine | 0 | R/W |

TABLE 1-continued

Sar Control Register

| Word Offset | Bit Offset | Bit Field | Function | Reset State | R/W |
|---|---|---|---|---|---|
|   | 2 | Enable Pacing Clock | Enables pacing clock | 0 | R/W |

TABLE 2

Sar Segmentatiom Context Register

| Word Offset | Bit Offset | Bit Field | Function | Reset State | R/W |
|---|---|---|---|---|---|
| 0 | 0:31 | Value | Context start address | 0 | R/W |

---

ANNEXE 1

```
InputFile ::= Typedefs
Typedefs ::= Typedef {Typedef}
Typedef ::= <TypedefToken> <StructToken> TypedefStructureName TypedefBody
TypedefBody ::= <OpenBraceToken> AttributeDefinitions <ClosingBraceToken>
                TypedefIdentifierName <SemiColonToken>
AttributeDefinitions ::= AttributeDefinition {AttributeDefinition}
AttributeDefinition ::= AttributeType AttributeIdentifierName {<ColonToken> AttributeTypeBitSize}
                <SemiColonToken> {AttributeCommentsField}
AttributeType ::= ValidAttributeType
AttributeCommentsField ::= {AttributeReadWriteComment} AttributeFunctionComments
ValidAttributeType ::= BoolType | Uint32Type | St20wordType | Ust20wordType | ByteType |
                UByteType | Int16Type | UInt16Type | UWordType | WordType | {OtherType}
AttributeReadWriteComment ::= <OpenCStyleCommentToken> ReadWriteSelector <CloseCStyleCommentToken>
ReadWriteSelector ::= ReadSelect | WriteSelect | ReadWriteSelect
AttributeFunctionComments ::= AttributeFunctionComment {AttributeFunctionComment}
AttributeFunctionComment ::= <OpenCStyleCommenToken> FunctionSpecifier <CloseCStyleCommentToken>
BoolType ::= BOOL
Uint32Type ::= UINT32
St20wordType ::= ST20WORD
Ust20wordType ::= UST20WORD
ByteType ::= BYTE
UByteType ::= UBYTE
Int16Type ::= INT16
UInt16Type ::= UINT16
UWordType ::= UWORD
WordType ::= WORD
CloseCStyleCommentToken ::= */
OpenCStyleCommentToken ::= /*
SemiColonToken ::= ;
ColonToken ::= :
```

---

ANNEXE 2

```
typedef struct BasepageptrS {
    UST20WORD Value ;
} BASEPAGEPTR;
```

---

ANNEXE 3

```
typedef struct SegmentationControls {
    BOOL    StartSegmentation    : 1 ;
    BOOL    EnablePacingEngine   : 1 ;
    BOOL    EnablePacingClock    : 1 ;
    BOOL    IdleCellGeneration   : 1 ;
} SEGMENTATIONCONTROL ;
```

-continued

ANNEXE 4

ReadFunction ::= ReturnType ReadFunctionName ParameterList FunctionDeclaration
ReturnType ::= Ust20wordType
ReadFunctionName ::= ReadFromToken TypedefStructureName
ParameterList ::= <OpenBracketToken> Int32Type AddressToken<CommaToken> CharType StarDataToken <CommaToken> Int32Type
    NumberOfBytesToken <CommaToken> Int32Type CycleToken <CommaToken> TypedefIndentifierName <StarToken>
    ParameterIdentifierName <CloseBracketToken>
FunctionDeclaration ::= <OpenBraceToken> FunctionBody <ClosingBraceToken>
FunctionBody ::= PsuedoRegisterDeclaration PsuedoRegisterInitialisation PsuedoRegisterAssignment TransferWordToTransputerInvocation
    ReturnStatement
PsuedoRegisterDeclaration ::= Ust20type PsuedoRegisterToken <SemicolonToken> <CarriageReturnToken>
PsuedoRegisterInitialisation ::= PsuedoRegisterToken <EqualsToken> ZeroToken <SemicolonToken> <CarriageReturnToken>
PsuedoRegisterAssignment ::= AttributesToRegisterAssignments
AttributesToRegisterAssignments ::= AttributesToRegisterAssignment {AttributesToRegisterAssignment}
AttributesToRegisterAssignment ::= PsuedoRegister <BitOrToken> AttributeDereferenceAndShift <SemicolonToken> <CarriageReturnToken>
AttributeDereferenceAndShift ::= <OpenBracketToken> <OpenBracketToken> <OpenBracketToken> <OpenBracketToken> CastToUst20DataType
    <CloseBracketToken> <OpenBracketToken> AttributeDereference <CloseBracketToken> <CloseBracketToken>
    <ShiftUpToken> AttributeInRegisterBitsShift <CloseBracketToken> <BitAndToken> AttributeInRegisterBits
    <CloseBracketToken>
CastToUSt20DataType ::= <OpenBracketToken> Ust20type <CloseBracketToken>
AttributeDereference ::= ParameterIdentifierName<ArrowToken>AttributeIdentifierName
TransferWordToTransputerInvocation ::= TransferWordToTransputerToken TransferWordToTransputerInvocationParameterList <SemicolonToken>
    <CarriageReturnToken>
TransferWordToTransputerInvocationParameterList ::= <OpenBracketToken> TransferWordToTransputerInvocationParameters
    <CloseBracketToken>
TransferWordToTransputerInvocationParameters ::= DataToken<CommaToken>AddressOfPsuedoRegisterToken
ReturnStatement ::= ReturnToken CastToUSt20DataType NumberOfBytesToken <SemicolonToken> <CarriageReturnToken>

ANNEXE 5

```
#define SEGMENTATIONCONTROLSTARTSEGMENTATIONBIT 0x1
#define SEGMENTATIONCONTROLENABLEPACINGENGINEBIT 0x2
#define SEGMENTATIONCONTROLENABLEPACINGCLOCKBIT 0x4
#define SEGMENTATIONCONTROLIDLECELLGENERATIONBIT 0x8
#define SEGMENTATIONCONTROLSTARTSEGMENTATIONSHIFT 0x0
#define SEGMENTATIONCONTROLENABLEPACINGENGINESHIFT 0x1
#define SEGMENTATIONCONTROLENABLEPACINGCLOCKSHIFT 0x2
#define SEGMENTATIONCONTROLIDLECELLGENERATIONSHIFT 0x3
UST20WORD Read From SegmentationControlRegister(INT32 Address, char *Data, INT32 NumberOfBytes, INT32 Cycles,
                                                SEGMENTATIONCONTROL *SegmentationControlRegister)
{
    UST20WORD PsuedoRegister ;
    PsuedoRegister = 0 ;
    PsuedoRegister =PsuedoRegister | ((((UST20WORD)
            (SegmentationControlRegister->StartSegmentation)) << SEGMENTATIONCONTROLSTARTSEGMENTATIONSHIFT) &
            SEGMENTATIONCONTROLSTARTSEGMENTATIONBIT) ;
    PsuedoRegister = PsuedoRegister | ((((UST20WORD)
            (SegmentationControlRegister->StartSegmentation)) << SEGMENTATIONCONTROLENABLEPACINGENGINESHIFT) &
            SEGMENTATIONCONTROLENABLEPACINGENGINEBIT) ;
    PsuedoRegister = PsuedoRegister | ((((UST20WORD)
            (SegmentationControlRegister->StartSegmentation)) << SEGMENTATIONCONTROLENABLEPACINGCLOCKSHIFT) &
            SEGMENTATIONCONTROLENABLEPACINGCLOCKBIT);
    PsuedoRegister = PsuedoRegister | ((((UST20WORD)
            (SegmentationControlRegister->StartSegmentation)) << SEGMENTATIONCONTROLIDLECELLGENERATIONSHIFT) &
            SEGMENTATIONCONTROLIDLECELLGENERATIONBIT) ;
    TransferWordToTransputer (Data, &PsuedoRegister) ;
    return (UST20WORD) NumberOfBytes ;
}
```

ANNEXE 6

WriteFunction ::= WriteReturnType WriteFunctionName WriteParameterList WriteFunctionDeclaration
WriteReturnType ::= VoidType
WriteFunctionName ::= WriteToToken TypedefStructureName
WriteParameterList ::= <OpenBracketToken> Int32Type AddressToken<CommaToken> CharType StarDataToken <CommaToken> Int32Type
    NumberOfBytesToken <CommaToken> Int32Type CycleToken <CommaToken> TypedefIndentiferName <StarToken>
    ParameterIdentifierName <CloseBracketToken>
WriteFunctionDeclaration ::= <OpenBraceToken> WriteFunctionBody <ClosingBraceToken>
WriteFunctionBody ::= PsuedoRegisterDeclaration PsuedoRegisterInitialisation TransferWordFromTransputerInvocation RegisterDereferenceAssignment
PsuedoRegisterDeclaration ::= Ust20type PsuedoRegisterToken <SemicolonToken> <CarriageReturnToken>
PsuedoRegisterInitialisation ::= PsuedoRegisterToken <EqualsToken> ZeroToken <SemicolonToken> <CarriageReturnToken>
TransferWordFromTransputerInvocation ::= TransferWordFromTransputerToken TransferWordFromTransputerInvocationParameterList
    <SemicolonToken> <CarriageReturnToken>
TransferWordFromTransputerInvocationParameterList ::= <OpenBracketToken> TransferWordFromTransputerInvocationParameters
    <CloseBracketToken>
TransferWordFromTransputerInvocationParameters ::= AddressOfPsuedoRegisterToken <CommaToken>DataToken
RegisterDereferenceAssignment ::= AttributeAssignments
AttributeAssignments ::= AttributeAssignment [AttributeAssignment]

-continued

AttributeAssignment ::= AttributeDeferenceAndAssignment
AttributeDeferenceAndAssignment ::= AttributeInRegisterDereference <EqualsToken> ValueAssignment <SemicolonToken> <CarriageReturnToken>
AttributeInRegisterDereference ::= ParameterIdentifierName<ArrowToken>AttributeIdentifierName
ValueAssignment ::= ValueDerivedFromRegister
ValueDerivedFromRegister ::= CastToAttributeType <OpenBracketToken> <OpenBracketToken> PsuedoRegister <BitAndToken>
                                AttributeInRegisterBitsConstant <CloseBracketToken> <ShiftDownToken>
                                AttributeInRegisterBitsShift <CloseBracketToken>
CastToAttributeType ::= <OpenBracketToken> AttributeType <CloseBracketToken>

ANNEXE 7

```
#define SEGMENTATIONCONTROLSTARTSEGMENTATIONBIT 0x1
#define SEGMENTATIONCONTROLENABLEPACINGENGINEBIT 0x2
#define SEGMENTATIONCONTROLENABLEPACINGCLOCKBIT 0x4
#define SEGMENTATIONCONTROLIDLECELLGENERATIONBIT 0x8
#define SEGMENTATIONCONTROLSTARTSEGMENTATIONSHIFT 0x0
#define SEGMENTATIONCONTROLENABLEPACINGENGINESHIFT 0x1
#define SEGMENTATIONCONTROLENABLEPACINGCLOCKSHIFT 0x2
#define SEGMENTATIONCONTROLIDLECELLGENERATIONSHIFT 0x3
void WriteToSegmentationControl (INT32 Address, char *Data, INT32 NumberOfBytes, INT32 Cycles, SARSEGMENTATIONCONTROL
                                 *SegmentationControlRegister)
{
    UST20WORD PsuedoRegister ;
    PsuedoRegister = 0 ;
    TransferWordFromTransputer (&PsuedoRegister, Data) ;
    SegmentationControlRegister->StartSegmentation = (BOOL)
                                ((PsuedoRegister & SEGMENTATIONCONTROLSTARTSEGMENTATIONBIT) >>
                                 SEGMENTATIONCONTROLSTARTSEGMENTATIONSHIFT) ;
    SegmentationControlRegister->EnablePacingEngine = (BOOL)
                                ((PsuedoRegister & SEGMENTATIONCONTROLENABLEPACINGENGINEBIT) >>
                                 SEGMENTATIONCONTROLENABLEPACINGENGINESHIFT) ;
    SegmentationControlRegister->EnablePacingClock = (BOOL)
                                ((PsuedoRegister & SEGMENTATIONCONTROLENABLEPACINGCLOCKBIT) >>
                                 SEGMENTATIONCONTROLENABLEPACINGCLOCKSHIFT) ;
    SegmentationControlRegister->IdleCellGeneration = (BOOL)
                                ((PsuedoRegister & SEGMENTATIONCONTROLCONTROLIDLECELLGENERATIONBIT) >>
                                 SEGMENTATIONCONTROLCONTROLIDLECELLGENERATIONSHIFT) ;
```

ANNEXE 8

QueryFunction ::= ReturnType QueryFunctionName ParameterList FunctionDeclaration
ReturnType ::= AttributeType
QueryFunctionName ::= AttributeIdentifierName InToken TypedefStructureName
ParameterList ::= <OpenBracketToken> TypedefIdentifierName <StarToken> ParameterIdentifierName <CloseBracketToken>
FunctionDeclaration ::= <OpenBraceToken> FunctionBody <ClosingBraceToken>
FunctionBody ::= ReturnStatement
ReturnStatement ::= ReturnToken RegisterDereference
RegisterDereference ::= ParameterIdentifierName<DashArrow>AttributeIdentifierName <SemicolonToken> <CarriageReturnToken>
TypedefStructureName ::= The name given to the structure of the typedef

ANNEXE 9

```
UST20WORD ValueInBasepagePtr (BASEPAGEPTR *Register)
{
        return Register->Value ;
}
```

ANNEXE 10

SetFunction ::= SetReturnType SetFunctionName SetParameterList SetFunctionDeclaration
SetReturnType ::= VoidType
SetFunctionName ::= := SetTokenAttributeIdentifierName InToken TypedefStructureName
SetParameterList ::= <OpenBracketToken> TypedefIdentifierName <StarToken> ParameterIdentifierName AttributeType ValueIdentifierName
                <CloseBracketToken>
SetFunctionDeclaration ::= <OpenBraceToken> SetFunctionBody <ClosingBraceToken>
SetFunctionBody ::= RegisterDereferenceAssignment
RegisterDereferenceAssignment ::= RegisterDereference <EqualsToken> AttributeIdentifierName <SemicolonToken> <CarriageReturnToken>
RegisterDereference ::= ParameterIdentifierName<ArrowToken>AttributeIdentiferName <EqualsToken> ValueIdentifierName

ANNEXE 11

```
void SetValueInBasepagePtr (BASEPAGEPTR *Pointer, UST20WORD AnyName)
{
        Pointer->Value = AnyName ;
}
```

-continued

ANNEXE 12

ReadFunction ::= ReturnType ReadFunctionName ParameterList FunctionDeclaration
ReturnType ::= UWordType
ReadFunctionName ::= ReadFromToken TypedefStructureName
ParameterList ::= <OpenBracketToken> VolatileToken TypedefIdentifierName StarToken ParameterIdentifierName <CloseBracketToken>
FunctionDeclaration ::= <OpenBraceToken> FunctionBody <ClosingBraceToken>
FunctionBody ::= ReturnStatement
ReturnStatement ::= ReturnToken CastToUWordDataType RegisterDereference
CastToUWordDataType ::= <OpenBracketToken> UWordtype <CloseBracketToken>
RegisterDereference ::= ParameterIdentifierName<ArrowToken>AttributeIdentifierName <SemicolonToken> <CarriageReturnToken>

ANNEXE 13

```
#define SEGMENTATIONCONTROLSTARTSEGMENTATIONBIT 0x1
#define SEGMENTATIONCONTROLENABLEPACINGENGINEBIT 0x2
#define SEGMENTATIONCONTROLENABLEPACINGCLOCKIT 0x4
#define SEGMENTATIONCONTROLIDLECELLGENERATIONBIT 0x8
UWORD ReadFromSegmentationControl (volatile SEGMENTATIONCONTROL *Pointer)
{
        return (UWORD) Pointer->Value ;
}
```

ANNEXE 14

WriteFunction ::= WriteReturnType WriteFunctionName WriteParameterList WriteFunctionDeclaration
WriteReturnType ::= VoidType
WriteFunctionName ::= WriteToToken TypedefStructureName
WriteParameterList ::= <OpenBracketToken> <VolatileToken> TypedefIdentifierName StarToken ParameterIdentifierName
                <ConstToken> UWordType ValueIdentifierName <CloseBracketToken>
WriteFunctionDeclaration ::= <OpenBraceToken> WriteFunctionBody <ClosingBraceToken>
WriteFunctionBody ::= RegisterDereference
RegisterDereference ::= ParameterIdentifierName<ArrowToken>AttributeIdentifierName <EqualsToken> ValueIdentifierName
                <SemicolonToken> <CarriageReturnToken>

ANNEXE 15

```
void WriteToBasepagePtr (volatile SEGMENTATIONCONTROL *Pointer, const UWORD Value)
{
        Pointer->Value = Value ;
}
```

ANNEXE 16

Documentation ::= FontCatalog TableDefinitions Paragraphs
FontCataglog ::= OpenStatement Fonts CloseStatement
Fonts ::= Font1 Font2 Font3
Font1 ::= OpenStatement FontToken Tag1 Family Angle Weight1 Size1 CloseStatement
Font2 ::= OpenStatement FontToken Tag2 Family Angle Weight2 Size1 CloseStatement
Font3 ::= OpenStatement FontToken Tag3 Family Angle Weight1 Size2 CloseStatement
Family ::= OpenStatement FamilyToken OpenSingleQuote FamilyString CloseSingleQuote CloseStatement
Angle ::= OpenStatement AngleToken OpenSingleQuote AngleString CloseSingleQuote CloseStatement
Tag1 ::= OpenStatement TagToken OpenSingleQuote Tag1String CloseSingleQuote CloseStatement
Tag2 ::= OpenStatement TagToken OpenSingleQuote Tag2String CloseSingleQuote CloseStatement
Tag2 ::= OpenStatement TagToken OpenSingleQuote Tag3String CloseSingleQuote CloseStatement
Weight1 ::= OpenStatement WeightToken OpenSingleQuote Weight1String CloseSingleQuote CloseStatement
Weight2 ::= OpenStatement WeightToken OpenSingleQuote Weight2String CloseSingleQuote CloseStatement
Size1 ::= OpenStatement SizeToken OpenSingleQuote Size1String CloseSingleQuote CloseStatement
Size2 ::= OpenStatement SizeToken OpenSingleQuote Size2String CloseSingleQuote CloseStatement
TableDefinitions ::= OpenStatement TblsToken TableDefinition {TableDefinition} CloseStatement
TableDefinition ::= OpenStatement TblToken TableConfig TableTitle TableHeader TableBody CloseStatement
TableConfig ::= TableID TableFormat TableNumberColumn TableColumnWidth
TableID ::= OpenStatement TblIDToken IDnumber CloseStatement
TableFormat ::= OpenStatement TblTagToken OpenSingleQuote FormatString CloseSingleQuote CloseStatement
TableNumberColumn ::= OpenStatement TblNumColumnsToken ColumnNumber CloseStatement
TableColumnWidth ::= Width1 Width1 Width2 Width2 Width1 Width3
Width1 ::= OpenStatement TblNumColumnWidthToken Width1String CloseStatement
Width2 ::= OpenStatement TblNumColumnWidthToken Width2String CloseStatement
Width3 ::= OpenStatement TblNumColumnWidthToken Width3String CloseStatement
TableTitle ::= OpenStatement TblTitleToken TableContent CloseStatement
TableContent ::= OpenStatement TblTitleContentToken ParaTitle CloseStatement
ParaTitle ::= OpenStatement ParaToken ParaTitleTag ParaTitleFont ParaTitleLine CloseStatement
ParaTitleTag ::= OpenStatement PgfTagToken OpenSingleQuote PgfTagTitleString CloseSingleQuote CloseStatement
ParaTitleFont ::= OpenStatement PgfFontToken TagTitle CloseStatement
TagTitle ::= OpenStatement TagToken OpenSingleQuote TagTitleString CloseSingleQuote CloseStatement
ParaTitleLine ::= OpenStatement ParaLineToken StringTitle CloseStatement
StringTitle ::= OpenStatement StringToken OpenSingleQuote TableName CloseSingleQuote CloseStatement
TableHeader ::= OpenStatement TblHToken RowHeader CloseStatement
RowHeader ::= OpenStatement RowToken CellsHeader CloseStatement -continued

```
CellsHeader ::= Cell1Header Cell2Header Cell3Header Cell4Header Cell5Header Cell6Header
Cell1Header ::= OpenStatement CellToken Cell2ContentHeader CloseStatement
Cell2Header ::= OpenStatement CellToken Cell2ContentHeader CloseStatement
Cell3Header ::= OpenStatement CellToken Cell3ContentHeader CloseStatement
Cell4Header ::= OpenStatement CellToken Cell4ContentHeader CloseStatement
Cell5Header ::= OpenStatement CellToken Cell5ContentHeader CloseStatement
Cell6Header ::= OpenStatement CellToken Cell6ContentHeader CloseStatement
Cell1ContentHeader ::= OpenStatement CellContentToken Para1Header CloseStatement
Cell2ContentHeader ::= OpenStatement CellContentToken Para2Header CloseStatement
Cell3ContentHeader ::= OpenStatement CellContentToken Para3Header CloseStatement
Cell4ContentHeader ::= OpenStatement CellContentToken Para4Header CloseStatement
Cell5ContentHeader ::= OpenStatement CellContentToken Para5Header CloseStatement
Cell6ContentHeader ::= OpenStatement CellContentToken Para6Header CloseStatement
Para1Header ::= OpenStatement ParaToken ParaHeaderTag ParaHeaderFont ParaLine1Header CloseStatement
ParaLine1Header ::= OpenStatement ParaLineToken String1Header CloseStatement
String1Header ::= OpenStatement StringToken OpenSingleQuote Header1Name CloseSingleQuote CloseStatement
Para2Header ::= OpenStatement ParaToken ParaHeaderTag ParaHeaderFont ParaLine2Header CloseStatement
ParaLine2Header ::= OpenStatement ParaLineToken String2Header CloseStatement
String2Header ::= OpenStatement StringToken OpenSingleQuote Header2Name CloseSingleQuote CloseStatement
Para3Header ::= OpenStatement ParaToken ParaHeaderTag ParaHeaderFont ParaLine3Header CloseStatement
ParaLine1Header ::= OpenStatement ParaLineToken String3Header CloseStatement
String3Header ::= OpenStatement StringToken OpenSingleQuote Header3Name CloseSingleQuote CloseStatement
Para4Header ::= OpenStatement ParaToken ParaHeaderTag ParaHeaderFont ParaLine4Header CloseStatement
ParaLine1Header ::= OpenStatement ParaLineToken String4Header CloseStatement
String4Header ::= OpenStatement StringToken OpenSingleQuote Header4Name CloseSingleQuote CloseStatement
Para5Header ::= OpenStatement ParaToken ParaHeaderTag ParaHeaderFont ParaLine5Header CloseStatement
ParaLine5Header ::= OpenStatement ParaLineToken String5Header CloseStatement
String5Header ::= OpenStatement StringToken OpenSingleQuote Header5Name CloseSingleQuote CloseStatement
Para6Header ::= OpenStatement ParaToken ParaHeaderTag ParaHeaderFont ParaLine6Header CloseStatement
ParaLine1Header ::= OpenStatement ParaLineToken String6Header CloseStatement
String6Header ::= OpenStatement StringToken OpenSingleQuote Header6Name CloseSingleQuote CloseStatement
ParaHeaderFont ::= OpenStatement PgfFontToken TagHeader CloseStatement
TagHeader ::= OpenStatement TagToken OpenSingleQuote TagHeaderString CloseSingleQuote CloseStatement
ParaHeaderTag ::= OpenStatement PgfTagToken OpenSingleQuote PgfTagHeaderString CloseSingleQuote CloseStatement
TableBody ::= OpenStatement TblBodyToken RowBody {RowBody} CloseStatement
RowBody ::= OpenStatement RowToken CellsBody ClosStatement | RowsStraddle
RowsStraddle ::= RowStraddleA RowStraddleB
RowsStraddleA ::= OpenStatement RowToken CellsBody StraddleA CloseStatement
RowsStraddleB ::= OpenStatement RowToken CellsBodyStraddleB CloseStatement
CellsBodyStraddleA ::= CellBodyStraddleA Cell2Body Cell3Body Cell4Body Cell5Body Cell6Body
CellsBodyStraddleB ::= CellBodyStraddleB Cell2Body Cell3Body Cell4Body Cell5Body Cell6Body
CellBodyStraddleA ::= OpenStatement CellToken CellRows Cell1ContentBody CloseStatement
CellRows ::= OpenStatement CellRowsToken StraddleNumber CloseStatement
CellBodyStraddleB ::= OpenStatement CellToken EmptyCellContent CloseStatement
EmptyCellContent ::= OpenStatement CellContentToken CloseStatement
CellsBody ::= Cell1Body Cell2Body Cell3Body Cell4Body Cell5Body Cell6Body
Cell1Body ::= OpenStatement CellToken Cell1ContentBody CloseStatement
Cell2Body ::= OpenStatement CellToken Cell2ContentBody CloseStatement
Cell3Body ::= OpenStatement CellToken Cell3ContentBody CloseStatement
Cell4Body ::= OpenStatement CellToken Cell4ContentBody CloseStatement
Cell5Body ::= OpenStatement CellToken Cell5ContentBody CloseStatement
Cell6Body ::= OpenStatement CellToken Cell6ContentBody CloseStatement
Cell1ContentBody ::= OpenStatement CellContentToken Para1Body CloseStatement
Cell2ContentBody ::= OpenStatement CellContentToken Para2Body CloseStatement
Cell3ContentBody ::= OpenStatement CellContentToken Para3Body CloseStatement
Cell4ContentBody ::= OpenStatement CellContentToken Para4Body CloseStatement
Cell5ContentBody ::= OpenStatement CellContentToken Para5Body CloseStatement
Cell6ContentBody ::= OpenStatement CellContentToken Para6Body CloseStatement
Para1Body ::= OpenStatement ParaToken ParaBodyTag ParaBodyFont ParaLine1Body CloseStatement
ParaLine1Body ::= OpenStatement ParaLineToken String1Body CloseStatement
String1Body ::= OpenStatement StringToken OpenSingleQuote Body1Name CloseSingleQuote CloseStatement
Para2Body ::= OpenStatement ParaToken ParaBodyTag ParaBodyFont ParaLine2Body CloseStatement
ParaLine2Body ::= OpenStatement ParaLineToken String2Body CloseStatement
String2Body ::= OpenStatement StringToken OpenSingleQuote Body2Name CloseSingleQuote CloseStatement
Para3Body ::= OpenStatement ParaToken ParaBodyTag ParaBodyFont ParaLine3Body CloseStatement
ParaLine3Body ::= OpenStatement ParaLineToken String3Body CloseStatement
String3Body ::= OpenStatement StringToken OpenSingleQuote Body3Name CloseSingleQuote CloseStatement
Para4Body ::= OpenStatement ParaToken ParaBodyTag ParaBodyFont ParaLine4Body CloseStatement
ParaLine4Body ::= OpenStatement ParaLineToken String4Body CloseStatement
String4Body ::= OpenStatement StringToken OpenSingleQuote Body4Name CloseSingleQuote CloseStatement
Para5Body ::= OpenStatement ParaToken ParaBodyTag ParaBodyFont ParaLine5Body CloseStatement
ParaLine5Body ::= OpenStatement ParaLineToken String5Body CloseStatement
String5Body ::= OpenStatement StringToken OpenSingleQuote Body5Name CloseSingleQuote CloseStatement
Para6Body ::= OpenStatement ParaToken ParaBodyTag ParaBodyFont ParaLine6Body CloseStatement
ParaLine6Body ::= OpenStatement ParaLineToken String6Body CloseStatement
String6Body ::= OpenStatement StringToken OpenSingleQuote Body6Name CloseSingleQuote CloseStatement
ParaBodyFont ::= OpenStatement PgfFontToken TagBody CloseStatement
TagBody ::= OpenStatement TagToken OpenSingleQuote TagBodyString CloseSingleQuote CloseStatement
ParaBodyTag ::= OpenStatement PgfTagToken OpenSingleQuote PgfTagBodyString CloseSingleQuote CloseStatement
```

-continued

```
Paragraphs ::= Paragraph {Paragraph}
Paragraph ::= OpenStatement ParaToken ParagraphContent CloseStatement
ParagraphContent ::= ParagraphTag ParagraphLine
ParagraphTag ::= OpenStatement PgfTagToken OpensingleQuote BODY CloseSingleQuote CloseStatement
ParagraphLine ::= OpenStatement ParaLineToken ParaLineContent CloseStatement
ParaLineContent ::= OpenStatement ATblToken IDNumber CloseStatement
TblsToken ::= Tbls
TblToken ::= Tbl
TblTagToken ::= TblTag
TblBodyToken ::= TblBody
TblNumColumnsToken ::= TblNumColumns
TblNumColumnWidthToken ::= TblNumColumnWidth
TblTitleToken ::= TblTitle
TblTitleContentToken ::= TblContent
CellRowsToken ::= CellRows
ParaToken ::= Para
PgfTagToken ::= PgfTag
ParaLineToken ::= ParaLine
StringToken ::= String
TblHToken ::= TblH
RowToken ::= Row
CellToken ::= Cell
CellContentToken ::= CellContent
PgfFontToken ::= PgfFont
TblIDToken ::= TblID
ATblToken ::= ATbl
FontToken ::= Font
TagToken ::= FTag
FamilyToken ::= FFamily
AngleToken ::= FAngle
WeightToken ::= FWeight
SizeToken ::= FSize
TagHeaderString ::= Tag1String
TagTitleString ::= Tag3String
TagBodyString ::= Tag2String
PgfTagTitleString ::= TableTitle
PgfTagHeaderString ::= CellHeading
PgfTagBodyString ::= CellBody
Width1String ::= 0.7
Width2String ::= 1.5
Width3String ::= 1.0
FormatString ::= Format A
FamilyString ::= Times
AngleString ::= Regular
Tag1String ::= NoWareHeading
Tag2String ::= NoWareBody
Tag3String ::= NowareTitle
Weight1String ::= Bold
Weight2String ::= Regular
Size1String ::= 11.0 pt
Size2String ::= 12.0 pt
OpenSingleQuote ::= '
CloseSingleQuote ::= '
TableName ::= TypedefIdentifierName
Header1Name ::= Word Offset
Header2Name ::= Bit Offset
Header3Name ::= Bit field
Header4Name ::= Function
Header5Name ::= Reset State
Header6Name ::= R/W
Body1Name ::= Current register number
Body2Name ::= Size of the attribute given in the input data structure
Body3Name ::= Name of the attribute given in the input data structure
Body4Name ::= Comment associated with the attribute within the input data structure
Body5Name ::= 0 | NULL
Body6Name ::= R/W comment given in the input data strucure
IDnumber ::= start at 1 and increment it
ColumnNumber ::= 6
StraddleNumber ::= Number of attributes within the current register
TableIdentifierName ::= Name given to the typedef of the data structure
CloseStatement ::= >
OpenStatement ::= <
```

What is claimed is:

1. A method of operating a computer system to design an application specific processor (ASP) modeled as a processor and a set of peripherals comprising:

defining said peripherals which are responsive to stimuli and which communicate with said processor;

generating for each peripheral an input file which defines the functional attributes of that peripheral in a high level language with an input data structure;

entering the input file into the computer system and operating a modelling tool loaded on the computer system to generate from the input file at least an interface functions file which defines the communication attributes of the peripheral with the processor and the functional attributes of the peripheral in a manner independent of any particular data structure, and a test functions file, separate from the interface functions file, which defines the communication attributes of the processor with the peripheral in a manner independent of any particular data structure;

using the interface functions file and test functions file to generate a functional model in a high level language for simulating the architectural behaviour of the ASP; and using the functional model to design the ASP.

2. A method according to claim 1, wherein the modelling tool additionally generates from the input file a register definition file by allocating specific elements of the input data structure to predefine sectors of a register definition table, the register definition file being usable to create in silicon the registers of the ASP.

3. A method according to claim 1, wherein the communication attributes of the peripheral include read and write functions which are generated from the input file by a naming convention which associates the functional description (read or write) with the name of each register in the input file.

4. A method according to claim 1, wherein the functional attributes of the peripheral include set and query functions which are generated from the input file using a naming convention which associates the functional definition with the name of each element in each register of the input file.

5. A method according to claim 1, wherein the communication attributes of the processor include read and write functions which are generated from the input file by associating the functional definition with the name of each register in the input file.

6. A computer system which comprises a processor and a memory, the memory holding a program representing a modeling tool for use in designing an application specific processor (ASP), wherein the computer system comprises an input means for receiving a plurality of input files, each input file defining the functional attributes of a peripheral for the ASP in a high level language within an input data structure;

the processor being operable to execute the program representing the modeling tool to generate from the input file at least an interface functions file which defines the communication attributes of the peripheral with the processor and the functional attributes of the peripheral in a manner independent of any particular data structure, and a test functions file, separate from the interface functions file, which defines the communication attributes of the processor with the peripheral in a manner independent of any particular data structure; and the computer system further comprising an output means for outputting said interface functions file and said test functions file in a manner such that they are usable to generate a functional model in a high level language for simulating the architectural behavior of the ASP.

7. A computer system according to claim 6, wherein the input means comprises means for receiving a physical recording device holding the input file for each peripheral.

8. A computer system according to claim 6, wherein the output means comprises means for loading the interface functions file and test functions file onto a physical recording device.

9. A modelling tool for use in defining an ASP which receives as its input an input file which for each of a set of peripherals defines the functional attributes of that peripheral in a high level language with an input data structure and which generates from the input file (i) an interface functions file, which defines the communication attributes of the peripheral with the processor and the functional attributes of the peripheral in a manner independent of any particular data structure, (ii) a test functions file which defines the communication attributes of the processor with the peripheral in a manner independent of any particular data structure, and (iii) a register definition file by allocating specific elements of the input data structure to predefined sectors of a register definition table.

10. A modelling tool as claimed in claim 9, stored in a computer readable medium which is loadable into a computer and which comprises software code portions for generating the interface functions file, the test functions file and the register definition file.

11. A computer program product stored on a computer usable medium and comprising:

a first code portion for reading an input file which defines for each of a set of peripherals the function of that peripheral in a high level language within an input data structure and for generating (i) an interface functions file, which defines the communication attributes of the peripheral with the professor and the functional attributes of the peripheral in a manner independent of any particular data structure;

a second code portion for reading said input file and generating (ii) a test functions file which defines the communication attributes of the processor with the peripheral in a manner independent of any particular data structure; and a third code portion for reading said input file and generating (iii) a register definition file by allocating specific elements of the input data structure to predefined sectors of a register definition table, wherein said code portions are executable by a computer in which the computer program product is loaded.

12. The method according to claim 1, wherein the act of generating comprises an act of generating a separate input file for each peripheral.

13. The modelling tool according to claim 9, wherein the modelling tool receives a separate input file for each peripheral of the set of peripherals.

14. The computer program product of claim 11, wherein each of the first, second and third code portions reads a separate input file for each peripheral.

* * * * *